(12) United States Patent
Taur et al.

(10) Patent No.: US 11,832,378 B2
(45) Date of Patent: Nov. 28, 2023

(54) CARRIER DEVICE FOR A THERMAL PAD OF AN INFORMATION HANDLING SYSTEM

(71) Applicant: Dell Products L.P., Round Rock, TX (US)

(72) Inventors: Jieh-I Taur, Taipei (TW); Bo-Wei Chu, Taipei (TW); Li-Chung Liu, Taoyuan (TW); Hui-Huan Chien, Taipei (TW)

(73) Assignee: Dell Products L.P., Round Rock, TX (US)

( * ) Notice: Subject to any disclaimer, the term of this patent is extended or adjusted under 35 U.S.C. 154(b) by 96 days.

(21) Appl. No.: 17/453,889

(22) Filed: Nov. 8, 2021

(65) Prior Publication Data

US 2023/0143361 A1  May 11, 2023

(51) Int. Cl.
*H05K 7/20* (2006.01)
*H05K 1/02* (2006.01)

(52) U.S. Cl.
CPC ......... *H05K 1/0203* (2013.01); *H05K 7/2039* (2013.01)

(58) Field of Classification Search
CPC .................... H05K 1/0203; H05K 7/2039
See application file for complete search history.

(56) References Cited

U.S. PATENT DOCUMENTS

| 2009/0141448 | A1* | 6/2009 | Ong | H05K 7/20172 |
| | | | | 361/695 |
| 2014/0272289 | A1* | 9/2014 | Savagian | G09F 3/0297 |
| | | | | 428/141 |
| 2017/0034900 | A1* | 2/2017 | Strader | H01L 23/36 |

* cited by examiner

*Primary Examiner* — Anthony Q Edwards
*Assistant Examiner* — Hung Q Dang
(74) *Attorney, Agent, or Firm* — McDermott Will & Emery LLP (57) ABSTRACT

In one embodiment, a carrier device for a thermal pad of an information handling system includes: a first adhesive surface coupled to the thermal pad, the thermal pad coupled to a first surface of a first component of the information handling system, the thermal pad configured to absorb a heat generated by the first component; a thermal transfer window configured to permit the heat generated by the first component to transfer from the thermal pad to a second surface of a second component of the information handling system; and a second adhesive surface removably coupled to the second surface of the second component.

18 Claims, 5 Drawing Sheets

```
ABSORB, BY A THERMAL PAD, A HEAT GENERATED BY A FIRST COMPONENT, THE THERMAL
PAD COUPLED TO A FIRST SURFACE OF THE FIRST COMPONENT.
510
           │
           ▼
TRANSFER, BY THE THERMAL PAD, THE HEAT TO A SECOND SURFACE OF A SECOND
COMPONENT VIA A HEAT TRANSFER WINDOW OF A CARRIER DEVICE.
520
```

FIG. 5

CARRIER DEVICE FOR A THERMAL PAD OF AN INFORMATION HANDLING SYSTEM

BACKGROUND

Field of the Disclosure

The disclosure relates generally to information handling systems, and in particular to a carrier device for a thermal pad in an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one embodiment, a disclosed carrier device for a thermal pad of an information handling system includes: a first adhesive surface coupled to the thermal pad, the thermal pad coupled to a first surface of a first component of the information handling system, the thermal pad configured to absorb a heat generated by the first component; a thermal transfer window configured to permit the heat generated by the first component to transfer from the thermal pad to a second surface of a second component of the information handling system; and a second adhesive surface removably coupled to the second surface of the second component.

In one or more of the disclosed embodiments, the carrier device further includes: an information tab extending from an edge of the carrier device, the information tab including a label indicating information associated with the first component.

In one or more of the disclosed embodiments, the carrier device further includes: an alignment window disposed on the information tab, the alignment window configured to align the carrier device with a device disposed on the second surface of the second component.

In one or more of the disclosed embodiments, the carrier device further includes: a conductive core disposed on the first adhesive surface, the conductive core configured to couple a first ground connection of the first component to a second ground connection of the second component.

In one or more of the disclosed embodiments, wherein the thermal pad includes: a conductive core window contoured to allow the conductive core to pass through the thermal pad.

In one or more of the disclosed embodiments, the thermal pad includes: a hole configured to permit the heat generated by the first component to transfer directly from the first component to the second surface of the second component via the thermal transfer window.

In one or more of the disclosed embodiments, the carrier device is comprised of a mylar material.

In one or more of the disclosed embodiments, the first component is a solid-state drive (SSD) memory device.

In one or more of the disclosed embodiments, the second component is a printed circuit board (PCB).

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

This document describes a carrier device for a thermal pad of an information handling system that includes: a first adhesive surface coupled to the thermal pad, the thermal pad coupled to a first surface of a first component of the information handling system, the thermal pad configured to absorb a heat generated by the first component; a thermal transfer window configured to permit the heat generated by the first component to transfer from the thermal pad to a second surface of a second component of the information handling system; and a second adhesive surface removably coupled to the second surface of the second component.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU)

or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-5 wherein like numbers are used to indicate like and corresponding parts.

Figure 1:
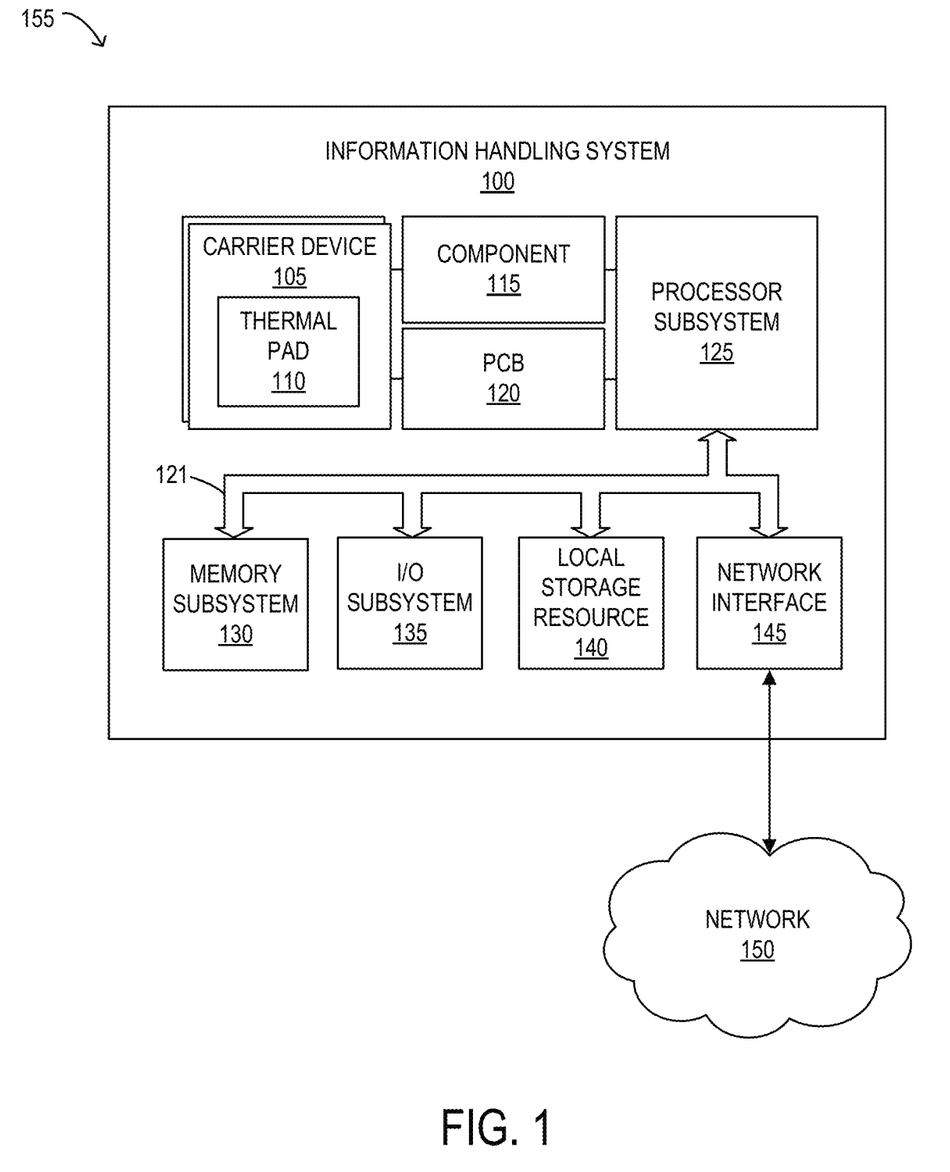
FIG. 1 is a block diagram of selected elements of an embodiment of a computing environment that includes an information handling system.

Turning now to the drawings, FIG. 1 is a block diagram of selected elements of an embodiment of a computing environment that includes an information handling system. Specifically, FIG. 1 illustrates a block diagram depicting selected elements of an information handling system 100 in accordance with some embodiments of the present disclosure. In other embodiments, information handling system 100 may represent different types of portable information handling systems, such as, display devices, head mounted displays, head mount display systems, smart phones, tablet computers, notebook computers, media players, foldable display systems, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems.

In the embodiment illustrated in FIG. 1, components of information handling system 100 may include, but are not limited to, a processor subsystem 125, which may comprise one or more processors, and system bus 121 that communicatively couples various system components to processor subsystem 125 including, for example, a memory subsystem 130, an I/O subsystem 135, a local storage resource 140, and a network interface 145. System bus 121 may represent a variety of suitable types of bus structures (e.g., a memory bus, a peripheral bus, or a local bus) using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express (PCIe) bus, HyperTransport (HT) bus, and Video Electronics Standards Association (VESA) local bus. As shown in FIG. 1, information handling system 100 may additionally include one or more carrier devices 105, one or more thermal pads 110, one or more components 115, and one or more printed circuit boards (PCBs) 120. In other embodiments, computing environment 155 may include additional, fewer, and/or different components than the components shown in FIG. 1.

In information handling system 100, processor subsystem 125 may comprise a system, device, or apparatus operable to interpret and/or execute program instructions and/or process data, and may include a central processing unit (CPU), microprocessor, microcontroller, digital signal processor (DSP), application specific integrated circuit (ASIC), or another digital or analog circuitry configured to interpret and/or execute program instructions and/or process data. In some embodiments, processor subsystem 125 may interpret and/or execute program instructions and/or process data stored locally (e.g., in memory subsystem 130 and/or another component of information handling system 100). In the same or alternative embodiments, processor subsystem 125 may interpret and/or execute program instructions and/or process data stored remotely. In one embodiment, processor subsystem 125 may be or include a multi-core processor comprised of one or more processing cores disposed upon an integrated circuit (IC) chip. In other embodiments, processor subsystem 125 may be or include an integrated device (e.g., microcontroller, system on a chip (SoC), and the like) that includes dedicated memory, peripheral interfaces, and/or other components suitable for interpreting and/or executing program instructions and/or processing data.

In one embodiment, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In one embodiment, I/O subsystem 135 may comprise a system, device, or apparatus generally operable to receive and/or transmit data to, from, and/or within information handling system 100. I/O subsystem 135 may represent, for example, a variety of communication interfaces, graphics interfaces, video interfaces, user input interfaces, and/or peripheral interfaces. In various embodiments, I/O subsystem 135 may be used to support various peripheral devices, such as a touch panel, a display adapter, a keyboard, an accelerometer, a touch pad, a gyroscope, an IR sensor, a microphone, a sensor, a camera, or another type of peripheral device.

In one embodiment, local storage resource 140 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data.

In one embodiment, network interface 145 may be a suitable system, apparatus, or device operable to serve as an interface between information handling system 100 and a network 150. Network interface 145 may enable information handling system 100 to communicate over network 150 using a suitable transmission protocol and/or standard, including, but not limited to, transmission protocols and/or standards enumerated below with respect to the discussion of network 150. Network 150 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), a Cloud network, an Edge network, an intranet, the Internet or another appropriate architecture or system that facilitates the communication of signals, data and/or messages (generally referred to as data). Network interface 145 may enable wired and/or wireless communications (e.g., NFC or Bluetooth) to and/or from information handling system 100.

In particular embodiments, network 150 may include one or more routers for routing data between client information handling systems 100 and server information handling systems 100. A device (e.g., a client information handling system 100 or a server information handling system 100) on network 150 may be addressed by a corresponding network address including, for example, an Internet protocol (IP) address, an Internet name, a Windows Internet name service (WINS) name, a domain name or other system name. In particular embodiments, network 150 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

In one embodiment, network 150 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 150 and its various components may be implemented using hardware, software, or any combination thereof.

In one embodiment, component 115 may comprise a system, device, or apparatus operable to retain data, and/or retrieve program instructions, for a period of time (e.g., computer-readable media). Specifically, component 115 may be or include a solid-state drive (SSD) memory device (e.g., SATA, NVMe, M.2, and the like) installed within, or otherwise communicably coupled to, information handling system 100 operable to retain data, and/or retrieve program instructions, for a user. In another embodiment, component 115 may be or include a hard disk drive (HDD) memory device. In one embodiment, component 115 may include a grounding connection comprised of a conductive material (e.g., copper, silver, gold-plated alloy, and the like) disposed on a surface of component 115 operable to cause errant current to flow from component 115 into a common point, or grounding connection, of an electrical circuit comprised of component 115 and PCB 120. In other embodiments, component 115 may be or include a random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to information handling system 100 is powered down.

In one embodiment, component 115 may be or include a wireless network device operable to provide information handling system 100 with access to a wireless network. In particular, component 115 may be or include a wireless wide area network (WWAN) card installed within, or otherwise communicably coupled to, information handling system 100 (e.g., proximate to a keyboard and/or keyboard support device of information handling system 100) operable to provide mobile telecommunication cellular network coverage (e.g., 3G, 4G, LTE, 5G, and the like) such that a user of information handling system 100 may access the Internet and/or a virtual private network (VPN) from locations within regional boundaries of the cellular network coverage. In one embodiment, component 115 may include a grounding connection comprised of a conductive material (e.g., copper, silver, gold-plated alloy, and the like) disposed on a surface of component 115 operable to cause errant current to flow from component 115 into a common point, or grounding connection, of an electrical circuit comprised of component 115 and PCB 120. In other embodiments, component 115 may be or include a network interface card (NIC), a universal serial bus (USB) network adapter, a peripheral component interconnect (PCI) network adapter, a virtual network adapter, and/or any other type of wireless and/or wired device suitable for providing access to a wireless network. Component 115 is described in further detail with respect to FIGS. 2A-4B.

In one embodiment, PCB 120 may be a suitable system, apparatus, or device operable to provide a substrate upon which one or more devices of information handling system 100 may be disposed. In particular, PCB 120 may be comprised of conductive and insulating layers operable to provide a structure on which one or more devices (e.g., processor subsystem 125, memory subsystem 130, local storage resource 140, and the like) may be communicably coupled within information handling system 100. For example, component 115 may be or include a motherboard of information handling system 100 operable to communicably couple one or more devices such that the one or more devices may perform respective computing operations. In one embodiment, PCB 120 may include a grounding connection comprised of a conductive material (e.g., copper, silver, gold-plated alloy, and the like) disposed on a surface of PCB 120 operable to cause errant current to flow from component 115 into a common point, or grounding connection, of an electrical circuit comprised of component 115 and PCB 120. PCB 120 is described in further detail with respect to FIGS. 2A-4B.

In one embodiment, thermal pad 110 may comprise a system, device, or apparatus operable to conduct heat away from component 115. In particular, thermal pad 110 may be or include a thermally conductive pad comprised of a soft, or malleable, material (e.g., paraffin wax, silicon rubber, and the like) operable to aid in the conduction of heat away from a component 115 (e.g., component 115 shown in FIG. 4A) and into a PCB 120 (e.g., PCB 120 shown in FIG. 4A). In one embodiment, thermal pad 110 may be used to occupy, or fill, one or more air gaps caused by deviations between smooth surfaces of component 115 and PCB 120 that are otherwise designed to be in thermal contact. In one embodiment, thermal pad 110 may be solid in structure at, or around, room temperature (e.g., 20° C.) but may become soft, or malleable, at as component 115 increases in temperature (e.g., 60° C.) during operation. In another embodiment, thermal pad 110 may be soft, or malleable, at room temperature such that the structural integrity of thermal pad 110 may become compromised when installed, uninstalled, or otherwise handled, by a user (e.g., a consumer, administrator, and/or manufacturer of information handling system 100). Thermal pad 110 is described in further detail with respect to FIGS. 2A-4B.

In one embodiment, carrier device 105 may comprise a system, device, or apparatus operable to provide a structure, or substrate, upon which thermal pad 110 may be coupled. Conventionally, a thermal pad may become soft, or malleable, during the operation of a component to which the thermal pad is coupled. In particular, the increased temperature caused by the component may cause internal changes to the molecular structure comprising the thermal pad, causing the thermal pad to transition from a solid structure to a soft, or malleable, structure. Further, a conventional thermal pad may be soft, or malleable, at room temperature prior to coupling to a component. As such, the structural integrity of thermal pads may become compromised when installed, uninstalled, or otherwise handled, by a user (e.g., a consumer, administrator, and/or manufacturer of information handling system). Such compromise of the structural integrity of thermal pads may result in improper placement, or positioning, of the thermal pads when coupled to components. The improper placement, or positioning, of thermal pads in relation to the components may result in excessive temperatures imposed upon the components, potentially causing damage to internal devices within the components and/or data loss, thereby decreasing system reliability and overall user experience.

In contrast, carrier device 105 may be comprised of a rigid material (e.g., mylar, plastic, metal, and the like) operable to provide a structure, or substrate, upon which thermal pad 110 may be coupled. In one embodiment, carrier device 105 may include double-sided adhesive surfaces, each comprised of an adhesive material (e.g., glue, epoxy, thermoplastic emulsion, and the like). In particular, carrier device 105 may include a first adhesive surface (e.g., a top surface) coupled to thermal pad 110 and a second adhesive surface (e.g., a bottom surface) removably coupled to PCB 120 and/or component 115. Here, the adhesive material included on the first adhesive surface may comprise a stronger adhesive material than the adhesive material included on the second adhesive surface. That is, the adhesive material included on the first adhesive surface may require a stronger tensile force to remove the thermal pad 110 from the first adhesive surface of the carrier device 105 than the tensile force required to remove carrier device 105 from the PCB 120 and/or component 115 to which carrier device 105 may be removably coupled. As such, carrier device 105 may be reusable throughout the lifespan of thermal pad 110. That is, carrier device 105 may be removed from PCB 120 and/or component 115 while maintaining the structural integrity of thermal pad 110 such that carrier device 105 may be removably coupled to a different (e.g., upgraded) PCB 120 and/or component 115 of information handling system 100 without requirement a replacement of thermal pad 110. Carrier device 105 is describe in further detail with respect to FIGS. 2A-4B.

Figure 2A:
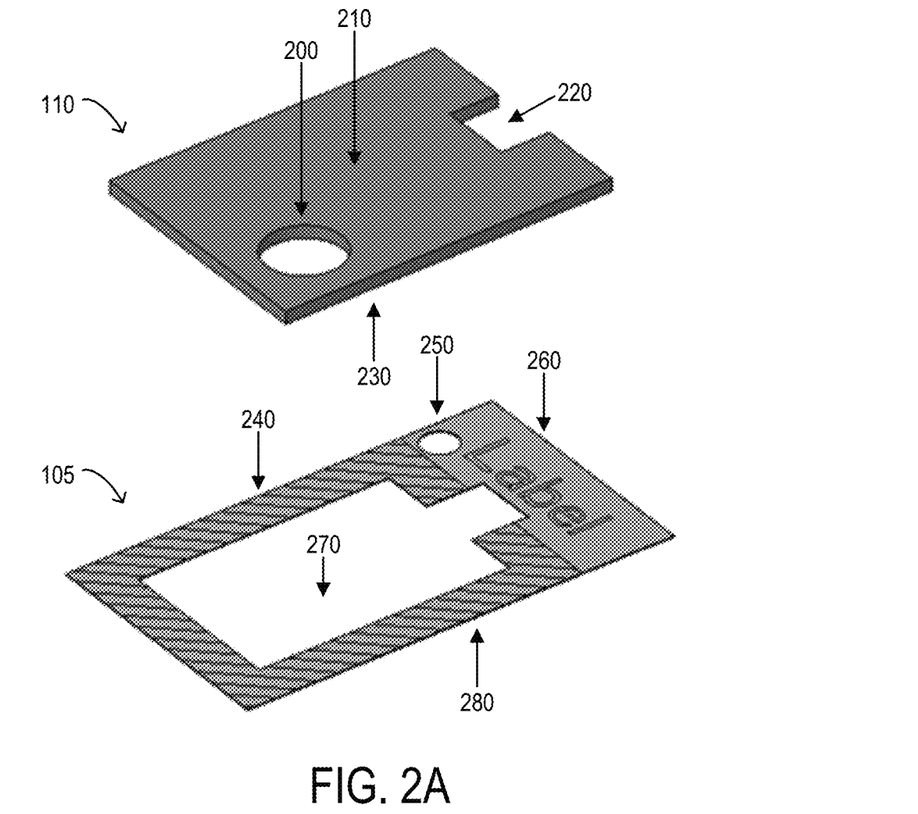
FIGS. 2A and 2B illustrate a front three-quarter view of selected elements of an embodiment of a thermal pad and a carrier device of an information handling system.
Figure 2B:
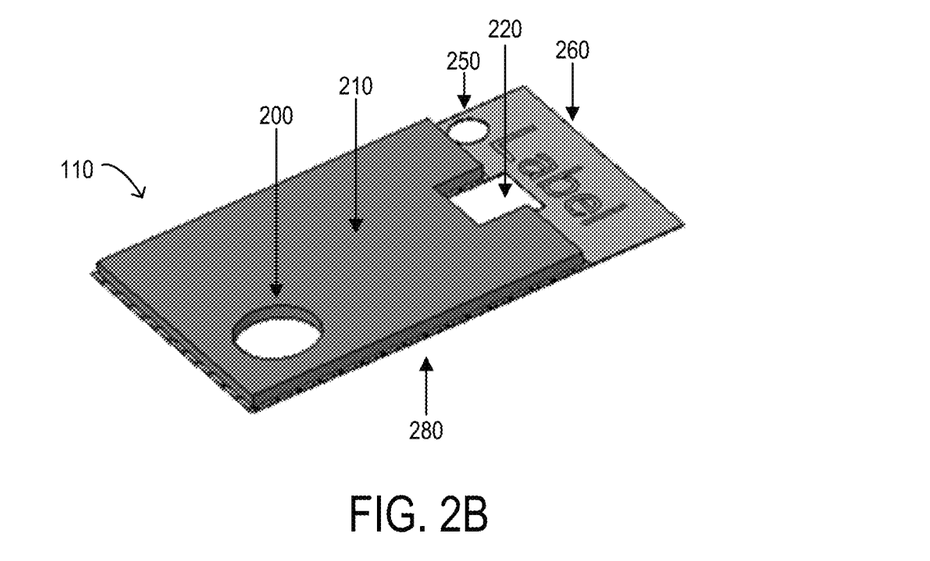

FIGS. 2A and 2B illustrate a front three-quarter view of selected elements of an embodiment of a thermal pad and a carrier device of an information handling system. In the embodiment illustrated in FIGS. 2A and 2B, thermal pad 110 includes a hole 200, a top surface 210, a recessed portion 220, and a bottom surface 230. Carrier device 105 includes a top adhesive surface 240, an alignment window 250, an information tab 260, a thermal transfer window 270, and a bottom adhesive surface 280. In other embodiments, thermal pad 110 and/or carrier device 105 may include additional, fewer, and/or different components than the components shown in FIGS. 2A and 2B.

In one embodiment, top surface 210 of thermal pad 110 may be coupled to component 115. In particular, top surface 210 may be coupled to a surface of component 115 such that thermal pad 110 may absorb a heat generated by component 115 during operation via top surface 210. As described above with respect to FIG. 1, thermal pad 110 may be used to occupy, or fill, one or more air gaps caused by deviations between smooth surfaces of component 115 and PCB 120 that are otherwise designed to be in thermal contact. For example, component 115 may be or include an SSD memory device installed, or otherwise communicably coupled, to PCB 120 such that thermal pad 110 (and carrier device 105) may be disposed between component 115 and PCB 120. In one embodiment, hole 200 may permit clearance for one or more devices disposed on a surface of PCB 120 to pass through thermal pad 110. In another embodiment, hole 200 may permit the heat generated by component 115, or a portion thereof, to transfer directly from component 115 to a surface of PCB 120 (via thermal transfer window 270 of carrier device 105) to further aid in the conduction of heat away from component 115. Similarly, recessed portion 220 of thermal pad 110 may permit the heat generated by component 115, or a portion thereof, to transfer directly from component 115 to the surface of PCB 120 (via thermal transfer window 270) to further aid in the conduction of heat away from component 115. As shown in FIGS. 2A and 2B, recessed portion 220 may be contoured in shape and/or dimension to align with a portion of thermal transfer window 270 disposed proximate to information tab 260.

In one embodiment, top adhesive surface 240 of carrier device 105 may be coupled to thermal pad 110. Specifically, top adhesive surface 240 may be coupled to bottom surface 230 of thermal pad 110 such that thermal pad 110 is coupled to carrier device 105. In the embodiment illustrated in FIGS. 2A and 2B, carrier device 105 may be removably coupled to a surface of PCB 120 via bottom adhesive surface 280. Here, thermal transfer window 270 may be or include a hole, or window, within carrier device 105 operable to permit the heat generated by component 115 (e.g., absorbed by thermal pad 110) to transfer from thermal pad 110 to the surface of PCB 120. That is, a surface of component 115 may be coupled to top surface 210 of thermal pad 110 such that thermal pad 110 may absorb heat generated by component 115 during operation. Additionally, bottom adhesive surface 280 of carrier device 105 may be removably coupled to a surface of PCB 120. Top adhesive surface 240 of carrier device 105 may be coupled to bottom surface 230 of thermal pad 110 such that the heat absorbed by thermal pad 110 may be transferred from thermal pad 110 to the surface of PCB 120 via thermal transfer window 270.

In the embodiment illustrated in FIGS. 2A and 2B, carrier device 105 includes information tab 260 operable to indicate, or otherwise display, information associated with component 115. Specifically, information tab 260 may extend from an edge of carrier device 105 such that a label of information tab 260 may be visible to a user (e.g., a consumer, administrator, and/or manufacturer of information handling system 100) to indicate, or otherwise display information associated with component 115. Because carrier device 105 may be reusable throughout the lifespan of thermal pad 110 as described above with respect to FIG. 1, information tab 260 may be used to indicate information associated with a current component 115 and/or modified to indicate information associated with a different (e.g., upgraded) component 115. In this way, carrier device 105 may provide information associated with component 115 to a user.

In the embodiment illustrated in FIGS. 2A and 2B, carrier device 105 includes alignment window 250 disposed on, or proximate to, information tab 260. In particular, alignment window 250 may be or include a hole, or window, operable to align carrier device 105 with one or more devices disposed on the surface of PCB 120. For example, alignment window 250 may be contoured in shape and/or dimension to align with a screw, bolt, and/or mechanical fastener disposed on a surface of PCB 120 operable to removably couple component 115 to the surface of PCB 120. In this way, alignment window 250 may ensure that a user (a consumer, administrator, and/or manufacturer of information handling system 100) may properly align carrier device 105 with one or more devices (e.g., port, slots, pins, and the like) disposed on a surface of PCB 120 such that thermal pad 110 may conduct heat away from component 115 in an optimal manner.

Figure 3A:
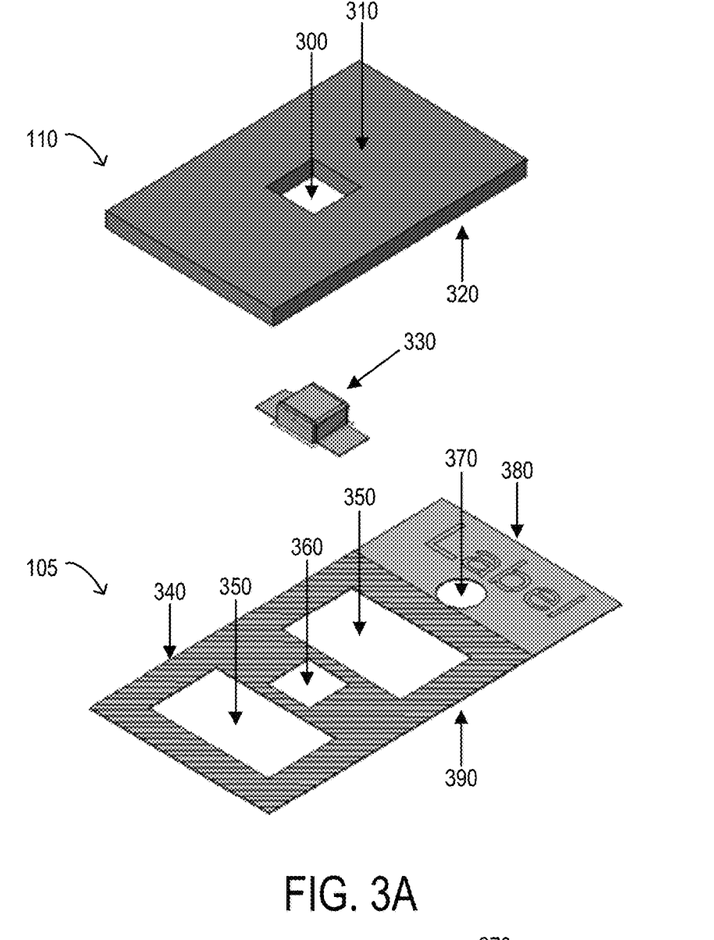
FIGS. 3A and 3B illustrate a front three-quarter view of selected elements of an embodiment of a thermal pad and a carrier device that includes a conductive core.
Figure 3B:
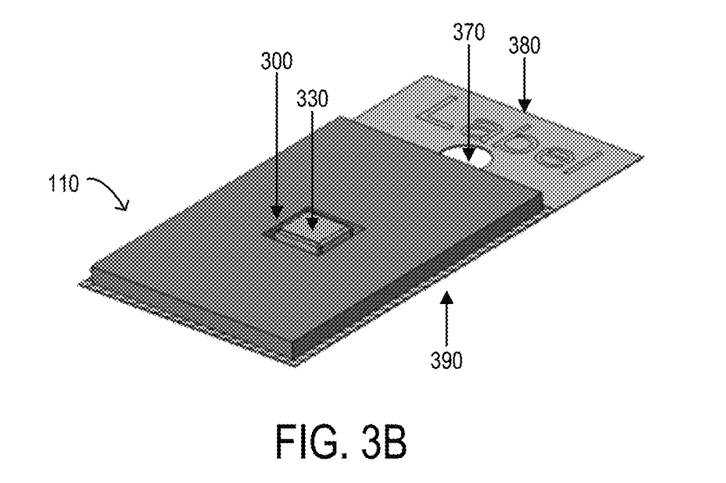

FIGS. 3A and 3B illustrate a front three-quarter view of selected elements of an embodiment of a thermal pad and a carrier device that includes a conductive core. In the embodiment illustrated in FIGS. 3A and 3B, thermal pad 110 includes a conductive core window 300, a top surface 310, and a bottom surface 320. Carrier device 105 includes a top adhesive surface 340, one or more thermal transfer windows 350, a conductive core 330, a grounding transfer window 360, an alignment window 370, an information tab 380, and a bottom adhesive surface 390. In other embodiments, thermal pad 110 and/or carrier device 105 may include additional, fewer, and/or different components than the components shown in FIGS. 3A and 3B.

In one embodiment, top surface 310 of thermal pad 110 may be coupled to component 115. In particular, top surface 310 may be coupled to a surface of component 115 such that thermal pad 110 may absorb a heat generated by component 115 during operation via top surface 310. As described above with respect to FIG. 1, thermal pad 110 may be used to occupy, or fill, one or more air gaps caused by deviations between smooth surfaces of component 115 and PCB 120 that are otherwise designed to be in thermal contact. For example, component 115 may be or include an WWAN device installed, or otherwise communicably coupled, to PCB 120 such that thermal pad 110 (and carrier device 105) may be disposed between component 115 and PCB 120.

In one embodiment, top adhesive surface 340 of carrier device 105 may be coupled to thermal pad 110. Specifically, top adhesive surface 340 may be coupled to bottom surface 320 of thermal pad 110 such that thermal pad 110 is coupled to carrier device 105. In the embodiment illustrated in FIGS. 3A and 3B, carrier device 105 may be removably coupled to a surface of PCB 120 via bottom adhesive surface 390. Here, thermal transfer windows 350 may be or include one or more holes, or windows, within carrier device 105 operable to permit the heat generated by component 115 (e.g., absorbed by thermal pad 110) to transfer from thermal pad 110 to the surface of PCB 120. That is, a surface of component 115 may be coupled to top surface 310 of thermal pad 110 such that thermal pad 110 may absorb heat generated by component 115 during operation. Additionally, bottom adhesive surface 390 of carrier device 105 may be removably coupled to a surface of PCB 120. Top adhesive surface 340 of carrier device 105 may be coupled to bottom surface 320 of thermal pad 110 such that the heat absorbed by thermal pad 110 may be transferred from thermal pad 110 to the surface of PCB 120 via thermal transfer windows 350.

In one embodiment, carrier device 105 may include information tab 380 operable to indicate, or otherwise display, information associated with component 115. Specifically, information tab 380 may extend from an edge of carrier device 105 such that a label of information tab 380 may be visible to a user (e.g., a consumer, administrator, and/or manufacturer of information handling system 100) to indicate, or otherwise display information associated with component 115. Because carrier device 105 may be reusable throughout the lifespan of thermal pad 110 as described above with respect to FIG. 1, information tab 380 may be used to indicate information associated with a current component 115 and/or modified to indicate information associated with a different (e.g., upgraded) component 115. In this way, carrier device 105 may provide information associated with component 115 to a user.

In one embodiment, carrier device 105 may include alignment window 370 disposed on, or proximate to, information tab 380. In particular, alignment window 370 may be or include a hole, or window, operable to align carrier device 105 with one or more devices disposed on the surface of PCB 120. For example, alignment window 370 may be contoured in shape and/or dimension to align with a screw, bolt, and/or mechanical fastener disposed on a surface of PCB 120 operable to removably couple component 115 to the surface of PCB 120. In this way, alignment window 370 may ensure that a user (e.g., a consumer, administrator, and/or manufacturer of information handling system 100) may properly align carrier device 105 with one or more devices (e.g., port, slots, pins, and the like) disposed on a surface of PCB 120 such that thermal pad 110 may conduct heat away from component 115 in an optimal manner.

In one embodiment, carrier device 105 may include conductive core 330 (as shown in FIG. 3B). Specifically, conductive core 330 may be disposed on top adhesive surface 340 of carrier device 105 at grounding transfer window 360. In one embodiment, conductive core 330 may be comprised of a conductive material (e.g., copper, silver, gold-plated alloy, and the like) operable to extend, or serve as a relay for, errant current between a grounding connection disposed on a surface of component 115 and a grounding connection disposed on a surface of PCB 120. That is, conductive core 330 may be coupled to, both, a grounding connection of component 115 and a grounding connection of PCB 120 such that an errant current may flow from the grounding connection of component 115, through conductive core 330, and into the grounding connection of PCB 120 (via grounding transfer window 360). As shown in FIGS. 3A and 3B, thermal pad 110 may include a conductive core window 300 contoured in shape and/or dimension to allow conductive core 330 to pass through thermal pad 110, thereby coupling to the grounding connection of component 115 above. In this way, conductive core window 300, conductive core 330, and grounding transfer window 360 may ensure that a user (a consumer, administrator, and/or manufacturer of information handling system 100) may properly install component 115 in relation to PCB 120 such that respective grounding connections between component 115 and PCB 120 align, thereby causing errant current to flow from component 115 in an optimal manner.

Figure 4A:
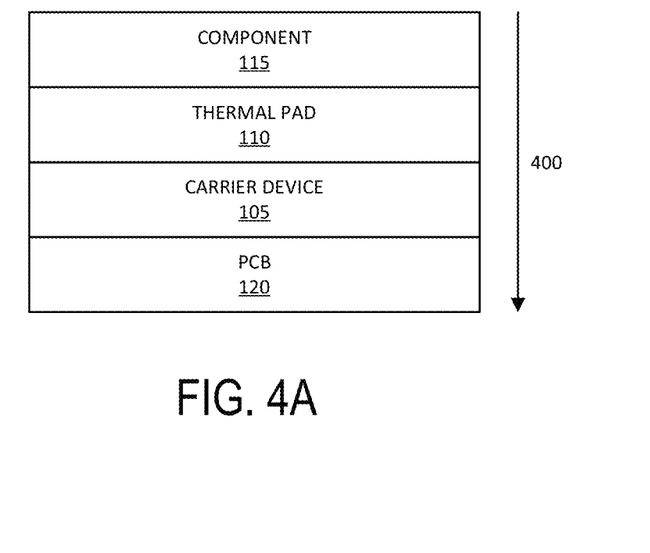
FIGS. 4A and 4B illustrate block diagrams of selected elements of an embodiment of a thermal distribution process using one or more thermal pads and one or more device carriers.
Figure 4B:
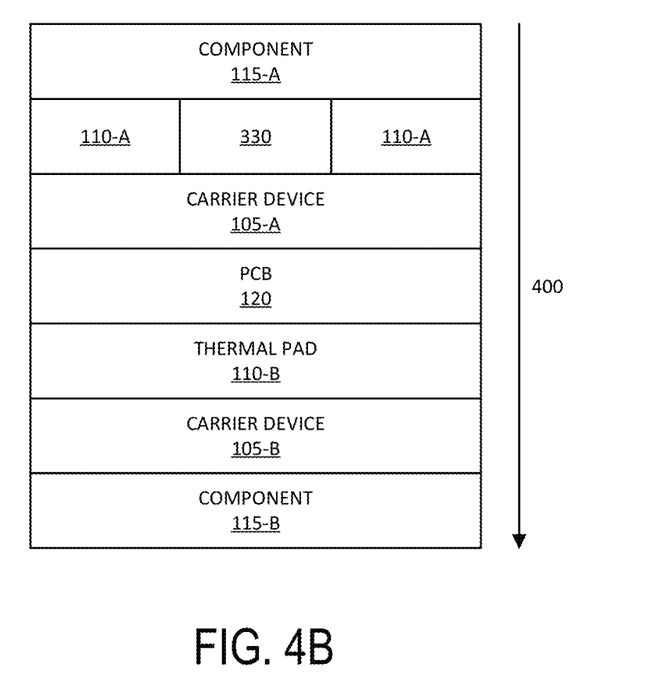

FIGS. 4A and 4B illustrate block diagrams of selected elements of an embodiment of a thermal distribution process using one or more thermal pads and one or more device carriers. In the embodiment illustrated in FIG. 4A, information handling system 100 may include a component 115, a thermal pad 110, a carrier device 105, and a PCB 120 as described above with respect to FIGS. 2A and 2B. Component 115 may be or include an SSD memory device as described above with respect to FIG. 1. In the embodiment illustrated in FIG. 4B, information handling system 100 may include two components 115-A and 115-B, two thermal pads 110-A and 110-B, two carrier devices 105-A and 105-B, and a PCB 120. Carrier device 105-A may include a conductive core 330 and grounding transfer window 360 (not shown in figure) as described above with respect to FIGS. 3A and 3B. In addition, thermal pad 110-A may include a conductive core window 300 (not shown in figure) as described above with respect to FIGS. 3A and 3B. Component 115-A may be or include a WWAN card as described above with respect to FIG. 1. Component 115-B may be or include a keyboard, and/or keyboard support device, of information handling system 100 operable to provide textual I/O support for information handling system 100. In other embodiments, information handling system 100 may include additional, fewer, and/or different components than the components shown in FIGS. 4A and 4B.

In the embodiment illustrated in FIG. 4A, thermal pad 110 may absorb heat generated by component 115. Specifically, thermal pad 110 may be coupled to a surface of component 115 such that heat generated by component 115 during operation may be absorbed by thermal pad 110 and conducted away from component 115. This is shown in FIG. 4A where thermal transfer 400 is directed away from component 115 and into thermal pad 110. Thermal pad 110 may then transfer the heat generated by component 115 to PCB 120. In particular, thermal pad 110 may transfer the heat generated by component 115, or a portion thereof, to a surface of PCB 120 via heat transfer window 270 (shown in FIG. 2A) of carrier device 105. This is shown in FIG. 4A where thermal transfer 400 is directed away from thermal pad 110, through carrier device 105 (i.e., thermal transfer window 270 of carrier device 105), and into PCB 120. In one embodiment, PCB 120 may dissipate the heat generated by component 115, or a portion thereof, upon receiving the heat via carrier device 105, thereby completing the thermal distribution process.

In the embodiment illustrated in FIG. 4B, thermal pad 110-A may absorb heat generated by component 115-A. In particular, thermal pad 110 may be coupled to a surface of component 115-A such that heat generated by component 115-A during operation may be absorbed by thermal pad 110-A and conducted away from component 115-A. This is shown in FIG. 4B where thermal transfer 400 is directed away from component 115-A and into thermal pad 110-A. Thermal pad 110-A may then transfer the heat generated by component 115-A to PCB 120. Specifically, thermal pad 110-A may transfer the heat generated by component 115-A, or a portion thereof, to a surface of PCB 120 via thermal transfer windows 350 (shown in FIG. 3A) of carrier device 105. This is shown in FIG. 4B where thermal transfer 400 is directed away from thermal pad 110-A, through carrier device 105-A (i.e., via thermal transfer windows 350), and into PCB 120. In one embodiment, PCB 120 may dissipate the heat generated by component 115-A, or a portion thereof, upon receiving the heat via carrier device 105-A. In one embodiment, conductive core 330 may be coupled to, both, a grounding connection of component 115-A and a grounding connection of PCB 120 such that an errant current may flow from the grounding connection of component 115-A, through conductive core 330, and into the grounding connection of PCB 120 (via grounding transfer window 360 shown in FIG. 3B).

In one embodiment, thermal pad 110-B may absorb the heat received by PCB 120. Specifically, thermal pad 110-B may be coupled to a surface of PCB 120 such that the heat received by PCB 120, or a portion thereof, may be absorbed by thermal pad 110-B and conducted away from PCB 120. This is shown in FIG. 4B where thermal transfer 400 is directed away from PCB 120 and into thermal pad 110-B. Thermal pad 110-B may then transfer the heat received by PCB 120, or a portion thereof, to a surface of component 115-B via thermal transfer window 270 (shown in FIG. 2A) of carrier device 105-B. This is shown in FIG. 4B where thermal transfer 400 is directed away from thermal pad 110-B, through carrier device 105-B (i.e., via thermal transfer window 270), and into component 115-B. In one embodiment, component 115-B may dissipate the heat received by PCB 120, or a portion thereof, upon receiving the heat via carrier device 105-B, thereby completing the thermal distribution process.

Figure 5:
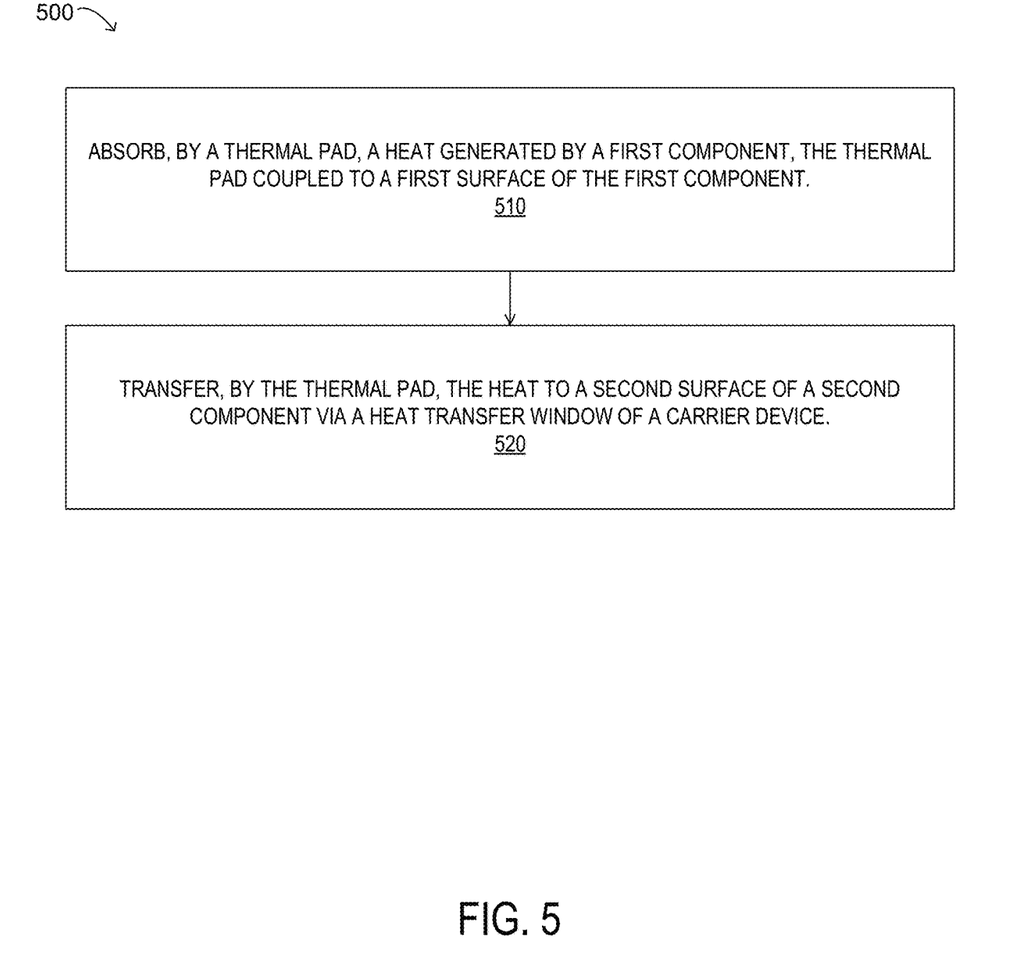
FIG. 5 is a flowchart depicting selected elements of an embodiment of a method for managing thermal distribution for a component of an information handling system.

FIG. 5 is a flowchart depicting selected elements of an embodiment of a method for managing thermal distribution for a component of an information handling system. It is noted that certain operations described in method 500 may be optional or may be rearranged in different embodiments.

Method 500 may begin at step 510, where a thermal pad may absorb a heat generated by a first component. The thermal pad may be coupled to a first surface of the first component. For example, thermal pad 110 may be coupled to a surface of component 115 such that heat generated by component 115 during operation may be absorbed by thermal pad 110 and conducted away from component 115 as described above with respect to FIG. 4A. At step 520, the thermal pad may transfer the heat generated by the first component to a second surface of a second component of the information handling system via a heat transfer window of a carrier device of the information handling system. The carrier device may have a first adhesive surface coupled to the thermal pad and a second adhesive surface removably coupled to the second surface of the second component. For example, thermal pad 110 may transfer the heat generated by component 115, or a portion thereof, to a surface of PCB 120 via heat transfer window 270 (shown in FIG. 2A) of carrier device 105 as described above with respect to FIG. 4A. Top adhesive surface 240 of carrier device 105 may be coupled to bottom surface 230 of thermal pad 110 such that thermal pad 110 is coupled to carrier device 105 as described above with respect to FIGS. 2A and 2B. Bottom adhesive surface 280 of carrier device 105 may be removably coupled to a surface of PCB 120 as described above with respect to FIGS. 2A and 2B.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An information handling system, comprising:
a first component;
a second component;
a thermal pad coupled to a first surface of the first component, the thermal pad configured to absorb a heat generated by the first component, the thermal pad including a hole; and
a carrier device including:
a first adhesive surface coupled to the thermal pad;
a thermal transfer window configured to permit the heat generated by the first component to transfer from the thermal pad to a second surface of the second component; and
a second adhesive surface removably coupled to the second surface of the second component,
wherein the hole of the thermal pad is configured to permit the heat generated by the first component to transfer directly from the first component to the second surface of the second component via the thermal transfer window.

2. The information handling system of claim 1, wherein the carrier device further includes:
an information tab extending from an edge of the carrier device, the information tab including a label indicating information associated with the first component.

3. The information handling system of claim 2, wherein the carrier device further includes:
an alignment window disposed on the information tab, the alignment window configured to align the carrier device with a device disposed on the second surface of the second component.

4. The information handling system of claim 1, wherein the carrier device further includes:
a conductive core disposed on the first adhesive surface, the conductive core configured to couple a first ground connection of the first component to a second ground connection of the second component.

5. The information handling system of claim 4, wherein the thermal pad includes:
a conductive core window contoured to allow the conductive core to pass through the thermal pad.

6. The information handling system of claim 1, wherein the carrier device is comprised of a mylar material.

7. The information handling system of claim 1, wherein the first component is a solid-state drive (SSD) memory device.

8. The information handling system of claim 1, wherein the second component is a printed circuit board (PCB).

9. A method for managing thermal distribution for a first component of an information handling system, the method comprising:
absorbing, by a thermal pad, a heat generated by the first component, the thermal pad coupled to a first surface of the first component;
transferring, by a hole of the thermal pad, the heat generated by the first component directly to a second surface of a second component of the information handling system via a heat transfer window of a carrier device of the information handling system, the carrier device having a first adhesive surface coupled to the thermal pad and a second adhesive surface removably coupled to the second surface of the second component.

10. The method of claim 9, further comprising:
coupling, by a conductive core disposed on the first adhesive surface of the carrier device, a first ground connection of the first component to a second ground connection of the second component via a conductive core window of the thermal pad.

11. A carrier device for a thermal pad of an information handling system, comprising:
a first adhesive surface coupled to the thermal pad, the thermal pad coupled to a first surface of a first component of the information handling system, the thermal pad configured to absorb a heat generated by the first component, the thermal pad including a hole;
a thermal transfer window configured to permit the heat generated by the first component to transfer from the thermal pad to a second surface of a second component of the information handling system; and
a second adhesive surface removably coupled to the second surface of the second component,
wherein the hole is configured to permit the heat generated by the first component to transfer directly from the first component to the second surface of the second component via the thermal transfer window.

12. The carrier device of claim 11, wherein the carrier device further comprises:
an information tab extending from an edge of the carrier device, the information tab including a label indicating information associated with the first component.

13. The carrier device of claim 12, wherein the carrier device further comprises:
an alignment window disposed on the information tab, the alignment window configured to align the carrier device with a device disposed on the second surface of the second component.

14. The carrier device of claim 11, wherein the carrier device further comprises:
a conductive core disposed on the first adhesive surface, the conductive core configured to couple a first ground connection of the first component to a second ground connection of the second component.

15. The carrier device of claim 14, wherein the thermal pad includes:
a conductive core window contoured to allow the conductive core to pass through the thermal pad.

16. The carrier device of claim 14, wherein the carrier device is comprised of a mylar material.

17. The carrier device of claim 14, wherein the first component is a solid-state drive (SSD) memory device.

18. The carrier device of claim 14, wherein the second component is a printed circuit board (PCB).

\* \* \* \* \*